United States Patent
Taylor et al.

(10) Patent No.: US 6,749,983 B1
(45) Date of Patent: Jun. 15, 2004

(54) POLYMERS AND PHOTORESIST COMPOSITIONS

(75) Inventors: Gary N. Taylor, Marlborough, MA (US); Charles R. Szmanda, Westborough, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 16 days.

(21) Appl. No.: 09/330,418

(22) Filed: Jun. 11, 1999

Related U.S. Application Data

(63) Continuation of application No. 08/963,922, filed on Nov. 4, 1997, now Pat. No. 6,057,083.

(51) Int. Cl.⁷ .......................... G03C 1/73; G03C 1/76; G03F 7/039
(52) U.S. Cl. .................... 430/270.1; 430/326; 430/910; 430/914; 430/271.1; 430/272.1; 430/311
(58) Field of Search .......................... 430/287.1, 270.1, 430/271.1, 272.1, 910, 914, 326, 311; 522/256, 266, 280, 297, 308, 327; 52/256, 266, 280, 297, 308, 327

(56) References Cited

U.S. PATENT DOCUMENTS

| | | | |
|---|---|---|---|
| 4,491,628 A | 1/1985 | Ito et al. | 430/176 |
| 4,810,613 A | 3/1989 | Osuch et al. | 430/192 |
| 4,883,740 A | 11/1989 | Schwalm et al. | 430/270.1 |
| 4,968,581 A | 11/1990 | Wu et al. | 430/192 |
| 5,075,199 A | 12/1991 | Schwalm et al. | 430/281.1 |
| 5,252,427 A | 10/1993 | Bauer et al. | 430/270.1 |
| 5,399,647 A | 3/1995 | Nozaki | 526/297 |
| 5,492,793 A | 2/1996 | Breyta et al. | 430/270.1 |
| 5,550,008 A | 8/1996 | Tomo et al. | 430/325 |
| 5,585,219 A | 12/1996 | Kaimoto et al. | 430/270.1 |
| 5,607,824 A | 3/1997 | Fahey et al. | 430/510 |
| 5,658,706 A * | 8/1997 | Niki et al. | 430/270.1 |
| 5,660,969 A | 8/1997 | Kaimoto | 430/270.1 |
| 5,679,495 A | 10/1997 | Yamachika et al. | 430/191 |
| 5,693,691 A | 12/1997 | Flaim et al. | 523/436 |
| 5,707,784 A | 1/1998 | Oikawa et al. | 430/313 |
| 5,786,131 A * | 7/1998 | Allen et al. | 430/325 |
| 5,972,559 A * | 10/1999 | Watanabe et al. | 430/270.1 |
| 6,054,254 A * | 4/2000 | Sato et al. | 430/322 |
| 6,060,207 A * | 5/2000 | Shida et al. | 430/176 |

FOREIGN PATENT DOCUMENTS

| | | |
|---|---|---|
| DE | 195 25 221 | 1/1996 |
| EP | 0 663 616 | 7/1995 |
| EP | 0 877 293 A2 * | 11/1998 |
| JP | 09 027102 | 1/1997 |
| WO | WO 97 27515 | 7/1997 |
| WO | WO 97/33198 * | 9/1997 |

OTHER PUBLICATIONS

Johnson et al *Evaluation of TER–SYSTEM resist for 193 nm Imaging* Proceedings of SPIE–Int'l Society for Optical Engineering, vol. 3049, pp. 997–1009, Mar. 1997.*
Shida et al., Accession No. 96–078277109, online Derwent Abstract, File WPAT, English abstract of DE 195 25 221, published Jan. 25, 1996.
Database WPI, Eciton Ch, Week 199304, Derwent Publications Ltd., London, GB; Class A14, AN 1993–030204 XP002133211 & JP 04 355761 A (Hitachi Chem. Co., Ltd.), Dec. 9, 1992. *Abstract.
Patent Abstracts of Japan, vol. 998, No. 4, Mar. 31, 1998 & JP 09 311210A (Toppan Printing Co.) *Abstract.

* cited by examiner

*Primary Examiner*—Mark F. Huff
*Assistant Examiner*—Sin J. Lee
(74) *Attorney, Agent, or Firm*—Peter F. Corless; Darryl P. Frickey; Edwards & Angell, LLP

(57) ABSTRACT

The present invention provides novel polymers and chemically-amplified positive-acting photoresist compositions that contain such polymers as a resin binder component. Preferred polymers of the invention include one or more structural groups that are capable of reducing the temperature required for effective deprotection of acid-labile moieties of the polymer.

9 Claims, No Drawings

POLYMERS AND PHOTORESIST COMPOSITIONS

This application is a continuation of application(s) application Ser. No. 08/963,922 filed on Nov. 4, 1997, now U.S. Pat. No. 6,057,083.

BACKGROUND OF THE INVENTION

1. Field of the Invention

The present invention relates to new polymers and use of such polymers as a resin binder component for photoresist compositions, particularly chemically-amplified positive-acting resists.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, Photoresist Materials and Processes, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their reaching of photoresist compositions and methods of making and using the same.

More recently, "chemically-amplified" resists have become of increased interest, especially for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a base soluble functional group is provided, e.g., carboxylic acid or imide, which results in different solubility characteristics in exposed and unexposed areas of the resist coating layer.

Also recently interest has increased in photoresists that can be photoimaged with short wavelength radiation, including exposure radiation having wavelengths of about 250 nm or less, or even about 200 nm or less, such as wavelengths of about 248 nm and 193 nm. Such photoresists offer the potential of forming images of smaller features than may be possible at longer wavelength exposures.

While currently available photoresists are suitable for many applications, current resists also can exhibit significant shortcomings, particularly in high performance applications such as formation of highly resolved sub-micron and sub-half micron features.

For example, many current chemically-amplified positive resists require use of relatively strong photogenerated acids and/or use of a relatively high temperature post-exposure bake (PEB) treatment to conduct the desired deprotection reaction.

However, in many instances, use of photoacid generators that produce weaker photoacids and use of relatively low PEB temperatures (e.g. 110° C. or less) would be a significant advantage. For example, if the desired deprotection chemistry could be carried out with a weaker acid, a wider range of photoacid generators could be potentially employed. Moreover, the industry continually seeks use of lowered post-exposure-bake temperatures because of uniformity considerations.

It thus would be desirable to have new photoresist compositions, particularly positive resist compositions that can be effectively imaged at short wavelengths, particularly sub-200 nm wavelengths such as 193 nm. It would be particularly desirable to have new chemically amplified positive photoresist compositions that employ photoacid generators that produce weaker photoacids and that can be activated with relatively low PEB temperatures.

SUMMARY OF THE INVENTION

The present invention provides novel polymers that contain repeating units that include acid-labile moieties that undergo a deprotection or cleavage reaction in the presence of photogenerated acid. The invention also includes photoresist compositions that comprise a photoactive component and a resin binder component that includes such a polymer with acid-labile moieties. Preferred photoresists of the invention are chemically-amplified positive resists that are imaged with deep UV wavelengths, including sub-300 nm and sub-200 nm wavelengths such as 248 nm and 193 nm.

Polymers of the invention include one or more structural groups that preferably are capable of reducing the temperature dependence of deprotection of the polymer's acid-labile moieties. That is, preferred polymers include moieties that can provide anchimeric assistance with photoacid-induced cleavage of the acid-labile leaving groups of the polymer. Such anchimeric assistance, also known as neighboring group participation, typically involves stabilization of a carbocation intermediate generated during deprotection of the polymer's acid labile groups.

Preferred polymer moieties that can provide anchimeric assistance in a photoacid-induced cleavage reaction will exhibit a value, A, of anchimeric assistance that is greater than the value, A, of achimeric assistance provided by pendant polymer moieties of —C(=O)Oadamantyl, —C(=O)Onorbornyl, or —C(=O)O cyclohexyl, with the same model compounds used to determine the value A of the preferred polymer moiety of the invention as well as the value A of —C(=O)Oadamantyl, —C(=O)Onorbornyl, or —C(=O)O cyclohexyl. The A of anchimeric assistance is defined to mean herein the value A as measured by the following rate constant ratio:

$$A = \frac{k - k_0}{k_0}$$

wherein that value A is the measured anchimeric assistance, k and $k_o$ are observed rate constants of test and model compounds respectively. The model compound is chosen to be as structurally akin to the test compound as possible. Thus for example, to determine value A for polymer moieties of —C(=O)Oadamantyl, the condensation product of adamanylacrylate could be the test compound and the model compound could be the condensation product of t-butylacrylate and having approximately the same molecular ($M_w$) and dispersity as the test compound of the adamantylacrylate polymer. Again, that same model compound would then be used to determine the value A for the preferred polymer moiety being considered. For a discussion of such determination of anichimeric assistance values, see N. S. Isaacs, Physical organic chemistry, ch. 13, particularly pages 646–650 thereof(2d edition, 1995, Longman Scientific & Technical, Essex, U.K.), incorporated herein by reference.

More specifically, pendant photoacid-labile groups that contain esters of bridged alicyclic groups will be suitable, particularly acid-labile esters of optionally substituted isobornyl. Other suitable bridged acid-labile esters include e.g. esters of fenchol, pinenol, 3,2,0 bridged-systems and 2,2,1-bridged systems. Esters of optionally substituted heteroatom-containing groups are also preferred, particularly bridged heteroalicyclic groups such as thio and oxo isobornyl and norbornyl derivatives. Also preferred are acid labile groups that are esters of optionally substituted small-ring alicyclic groups, e.g. optionally substituted cycloalkylgroups having 3 or 4 ring carbon atoms such as cyclopropylmethylene and cyclobutyl esters. Optionally substituted alkenyl esters are also preferred, particularly allyl-esters and "homo-allyl"-esters, such as alkenylesters of the formula —(C=O)O(CH$_2$)$_{1\ or\ 2}$—CH=CH$_2$ and which may be optionally substituted at available positions.

Without wishing to be bound by theory, it is believed that such photoacid-labile esters are capable of stabilizing a carbocation intermediate generated during photoacid-induced deprotection of a polymer's acid labile groups. For example, isobornyl groups and heteroalicyclics can form a stabilized delocalized carbocation. See Schemes I, II and III below. Small-ring alicyclics and alkenyl esters can form a stabilizing allylic cation during a deprotection reaction. See Scheme IV below.

Preferred polymers of the invention are substantially free of any phenyl or other aromatic groups to provide increased transparency at short exposure wavelengths, particularly sub-200 nm wavelengths such as 193 nm. References herein that a polymer is "substantially free" of phenyl or other aromatic groups mean the polymer has less than about 3 or 4 weight percent aromatic groups, based on total weight of the polymer. Even more preferred are polymers that have less than about 1 or 2 weight percent aromatic groups based on total weight of the polymer, and still more preferred are polymers that are completely free of aromatic groups.

Polymers of the invention may suitably contain units in addition to the above-mentioned acid-labile groups. For example, polymers of the invention may contain units that are essentially unreactive under typical lithographic processing of a photoresist containing the polymer as a resin binder component. Thus, for instance, polymers of the invention include pendant substituted and unsubstituted alicyclic groups such as alicyclic groups having 5 to about 18 carbons, e.g. substituted or unsubstituted isobornyl, norbornyl, 2-methyladamantyl, cyclohexyl, etc.

The invention also provides methods for forming relief images, including methods for forming a highly resolved relief image such as a pattern of lines where each line has essentially vertical sidewalls and a line width of about 400 nm or less, or even about 250 or 200 nm or less. The invention further provides articles of manufacture comprising substrates such as a microelectronic wafer or a liquid crystal display or other flat panel display substrate having coated thereon the photoresists and relief images of the invention. Other aspects of the invention are disclosed infra.

DETAILED DESCRIPTION OF THE INVENTION

As stated above, polymers of the invention in general comprise repeating units that include acid-labile moieties that undergo a deprotection reaction in the presence of photogenerated acid. The repeating units contain structural groups that are capable of reducing the temperature required for effective deprotection of the acid-labile moieties.

More particularly, preferred polymers comprise esters of bridged alicyclic groups that can stabilize a carbocation intermediate generated during a deprotection reaction. Isobornyl methacrylate units are particularly preferred. Without wishing to be bound by theory, such isobornyl units are believed to form an intermediate during the deprotection reaction that includes a delocalized carbocation as exemplified in the following Scheme I:

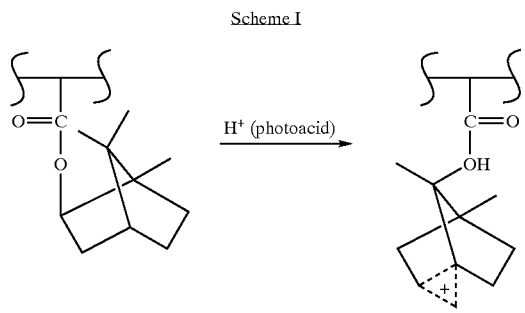

Scheme I

Esters of heteroatom-containing alicyclic groups are also preferred, particularly bridged heteroalicyclic groups as exemplified by the thionorbornyl and oxonorbornyl derivatives depicted in the following Schemes II and III. Again, without wishing to be bound by theory, thio derivatives as exemplified in Scheme II are believed to be capable of forming a stabilized sulfonium ion derivative, and oxo derivatives as exemplified in Scheme III are believed to be capable of forming a stabilized oxonium ion intermediate. It also should be appreciated that geometric relationships can be essential, e.g. the thionorbornyl group should be in the endo form shown in Scheme II to facilitate the photoacid-induced cleavage reaction.

Scheme II

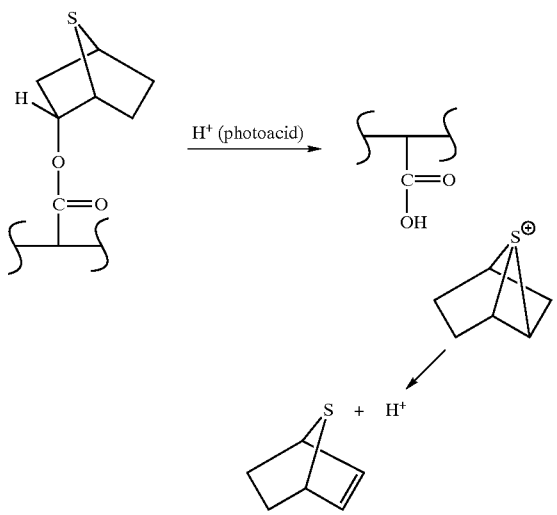

Scheme III

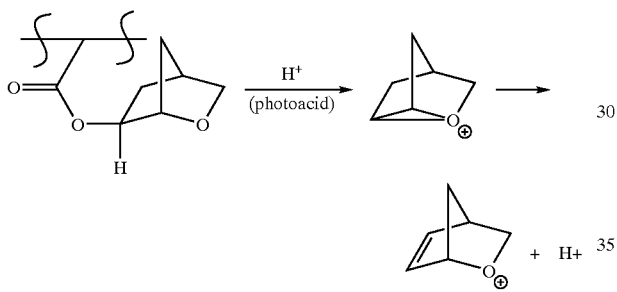

Also preferred are esters of small-ring alicyclic groups, particularly cycloalkyl having 3 or 4 ring carbon atoms such as cyclopropylmethylene and cyclobutyl esters. Alkenyl esters are also preferred. Such alicyclic and alkenyl groups are exemplified by the groups shown in the following Scheme IV:

Scheme IV

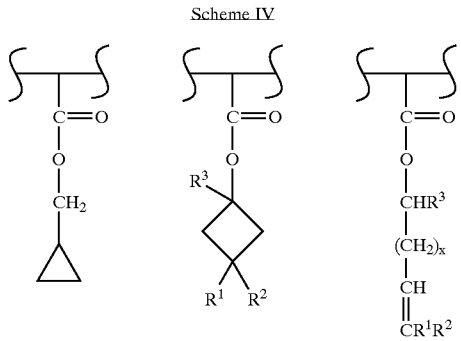

Again without being bound by theory, it is believed the groups shown in Scheme IV above form a single stabilized allylic cation intermediate upon reaction of the acid labile group with photogenerated acid, thereby lowering the energy required to effect the deprotection reaction and enhancing the reaction rate. In Scheme IV above, the depicted $R^1$, $R^2$ and $R^3$ groups suitably may be e.g. independently hydrogen; optionally substituted alkyl such as $C_{1-6}$ alkyl, more preferably $C_{1-3}$ alkyl, particularly methyl or ethyl; and the like; and x may be 0 or 1.

As mentioned, polymers of the invention may suitably contain other units in addition to the above-discussed acid labile esters. For instance, polymers of the invention may contain units that are essentially unreactive under typical lithographic processing of a photoresist containing the polymer as a resin binder component. Thus, for instance, polymers of the invention may suitably include pendant substituted and unsubstituted alicyclic groups such as alicyclic groups having 5 to about 18 carbons, e.g. substituted or unsubstituted isobornyl, norbornyl, 2-methyladamantyl, cyclohexyl, etc. As discussed above, for polymers used in photoresists imaged with short wavelength radiation (e.g. less than about 200 nm such as 193 nm), aromatic groups are less preferred because they decrease transparency of a resist. Polymers of the invention also may include units of other pendant groups such as pendant nitrile groups. The polymers of the invention also may comprise other acid labile groups such as alkyl esters e.g. t-butyl oxycarbonyl groups or cyclohexylcarbonyl groups, or acetate-type acid labile groups as disclosed in U.S. Pat. No. 5,258,257 to Sinta et al.

More specifically, suitable copolymers of the invention include those of the following formula I:

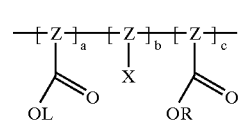

wherein

L is a stabilizing portion of a photoacid-labile group as discussed above such as optionally substituted isobornyl, fenchyl, pinenyl, 3,2,0 bridged-system, 2,2,1-bridged system, heteroalicyclic (e.g. having 1 to 3 ring members and 1 to 3 ring members such as the groups exemplified in Schemes II and III above), small ring alicyclic or alkenyl (such as —$(CH_2)_{1\ or\ 2}$—CH=CH$_2$);

X is nitrile; optionally substituted alicyclic typically having 3 to about 8 carbons such as isobornyl, norbornyl, adamantyl, cyclohexyl or cyclohexanone; optionally substituted heteroalicyclic such as tetrahydropyranyl, tetrahydrofuranyl and the like; optionally substituted alkyl, typically having from 1 to about 10 carbons; etc.

R is optionally substituted alkyl, preferably having from 1 to about 20 carbons, more preferably 1 to about 15 carbons; optionally substituted alkenyl, preferably having from 2 to about 20 carbons, more preferably having from 2 to about 15 carbons; optionally substituted alkynyl, preferably having from 2 to about 20 carbons, more preferably having from 2 to about 15 carbons; optionally substituted alkanoyl, preferably having from 1 to about 20 carbons, more preferably having from 1 to about 8 carbons; or optionally substituted heterocyclic having 1 to 3 ring members and 1 to about 3 hetero atoms such as tetrahydrofuranyl, tetrahydropyranyl, piperidinyl or pyrrolindinyl; and the like;

Z is a bridge group between polymer units, e.g. alkylene preferably having 1 to about 6 carbon atoms, more typically 1 to about 3 carbons and optionally substituted by alkyl having 1 to about 3 carbons, halogen, etc.; and a, b and c are the mole fractions or percents of the respective polymer units. Generally, a is in a range of from 1 to 100 percent, and b and c each independently vary from 0 to about 99 percent. Typically, a copolymer of the invention will contain at least about 2 to 3 mole percent of units with an L group, more typically at least 5 mole percent of such units.

Preferred polymers of Formula I include those where the only polymer units correspond to the general structures depicted in the Formula, where the sum of a, b and c is about 100 percent. However, preferred copolymers also may comprise additional units wherein the sum of such mole fractions would be less than one hundred.

The above-mentioned optionally substituted groups (including substituted groups L, R, Z, $R^1$, $R^2$ and $R^3$ moieties) may be substituted at one or more available positions by one or more suitable groups such as halogen (particularly F, Cl or Br); $C_{1-12}$ alkyl; $C_{1-12}$ alkoxy; $C_{2-12}$ alkenyl; $C_{2-12}$ alkynyl; aryl such as phenyl; alkanoyl, e.g. a $C_{1-12}$ alkanoyl such as acyl; nitro; cyano; and the like. Typically a substituted moiety is substituted at one, two or three available positions.

In the above formula, Z groups suitably will be substituted or unsubstituted alkylene preferably having 1 to about 10 carbon atoms, more typically 1 to about 6 carbons, or more preferably 1 to about 3 carbons and optionally substituted by alkyl having 1 to about 3 carbons, or Z is a substituted or unsubstituted alkenyl or alkynyl, preferably having 2 to about 10 carbons and optionally substituted by alkyl having 1 to about 3 carbons. Preferred Z groups include ethylene optionally substituted by $C_{1-3}$ alkyl such as methyl.

In the formula, it will be understood that alkyl, alkenyl and alkynyl each may be cyclic or straight or branched non-cyclic chains, unless otherwise specified. Exemplary cyclic groups include cyclohexyl, isobornyl, norbornyl, adamantyl and the like. Suitable heterocyclic L groups of formula I include isobornyl, norbornyl, adamantyl and the like that contain a N, O or S atom, particularly O or S atom, as a ring member such as thionorbornyl and oxonorbornyl depicted in Schemes II and III above. In certain preferred embodiments of the invention, polymers of the invention include those that comprise acid-labile groups (including, L with reference to formula I defined above) that contain essentially any alicyclic group, generally having from 5 to about 20 carbons, but with the exclusion of adamantyl, norbornyl, cyclohexyl and/or a tricyclic [5.2.1.0] decane skeleton.

Polymers of the invention can be prepared by a variety of methods. One suitable method is free radical polymerization, e.g., by reaction of a plurality of monomers to provide the various units as discussed above in the presence of a radical initiator under an inert atmosphere (e.g., $N_2$ or argon) and at elevated temperatures such as about 50° C. or greater, although reaction temperatures may vary depending on the reactivity of the particular reagents employed and the boiling point of the reaction solvent (if a solvent is employed). For example, for synthesis of an isobornyl ester polymer, isobornyl methacrylate or isobornyl acrylate can be polymerized under free radical conditions, e.g. in refluxing isopropanol in the presence of a free radical initiator such as 2,2'-azobisisobutyronitrile. For synthesis of a polymer containing esters of a 2,2,1-bridged system, suitable monomers for polymerization include (1-oxybicyclo 2,2,1 heptanyl)-4-methacrylate and (7-thiabicyclo 2,2,1 heptanyl) 2-methacrylate. Additional monomers (such as monomers containing alicyclic groups, monomers that contain nitrile groups or monomers containing other acid labile groups such as t-butyl or other alkyl acrylate units) can be copolymerized to provide the desired polymer. Such other monomers include e.g. optionally substituted vinyladamantane, vinylisobornyl, vinylnorbornyl, isobornylmethacrylates, adamantylmethacrylates, oxocyclohexyl methacrylate, methacrylonitrile, acrylonitrile, t-butyl acrylate, t-butyl methacrylate, methacrylic acid, itaconic anhydride, etc.

Suitable reaction temperatures to conduct a free radical polymerization for any particular system can be readily determined empirically by those skilled in the art based on the present disclosure. A reaction solvent may be employed if desired. Suitable solvents include ketones such as acetone, alcohols such as propanols and butanols, aromatic solvents such as benzene, chlorobenzene, toluene and xylene, and ethers such as tetrahydrofuran. Dimethylsulfoxide and dimethylformamide are also suitable. The polymerization reaction also may be run neat. A variety of free radical initiators may be employed to prepare the polymers of the invention. For example, azo compounds may be employed such as 2,2'-azobis-2,4-dimethyl-pentanenitrile, 2,2'-azobisisobutyronitrile (AIBN) and 1,1'-azobis (cyclohexanecarbonitrile). Peroxides, peresters, peracids and persulfates also can be employed. See the examples which follow for exemplary conditions.

Preferably a polymer of the invention will have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, polymers of the invention are highly useful as the resin binder component in chemically-amplified positive resists. Photoresists of the invention in general comprise a photoactive component and a resin binder component that contains the above-described polymer.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Generally, sulfonate compounds are preferred PAGs, particularly sulfonate salts. Two specifically preferred agents are the following PAGS 1 and 2:

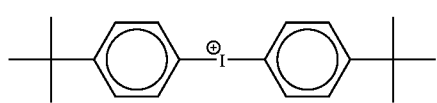

1

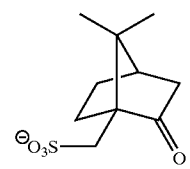

2

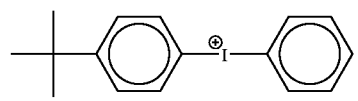

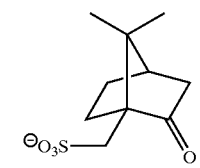

Such sulfonate compounds can be prepared as disclosed in European Patent Application 96118111.2 (publication number 0783136). Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to 5–10° C. and then (+/−)-10-camphorsulfonic acid added followed by neutralization with ammonium hydroxide. Sulfonate PAG 2 above can be prepared by those same procedures, except approximately molar equivalents of t-butyl benzene and benzene would be reacted together in the first step with acetic anhydride and $KIO_3$.

Also preferred are the above two iodonium compounds complexed with other counter anions than the above-depicted camphorsulfonate groups. In particular, preferred counter anions include those of the formula $RSO_3$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononylsulfonate and the like.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Further preferred PAGS include imidosulfonates such as compounds of the following formula:

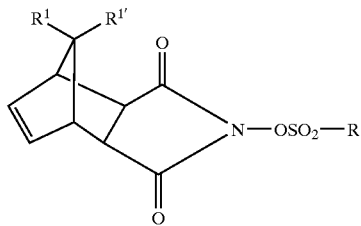

wherein each $R^1$ and $R^{1'}$ are each independently hydrogen or $C_{1-12}$ alkyl, more preferably hydrogen or methyl; and R is as defined above, i.e. camphor, adamantane, alkyl (e.g. $C_{1-12}$alkyl) and perfluoroalkyl such as perfluoro($C_{1-12}$alkyl), particularly perfluoro counter anions of perfluorooctanesulfonate, perfluorononylsulfonate and the like.

Triphenylsulfonium salts are also preferred PAGS for use in the photoresists of the invention, including compounds of the following formula:

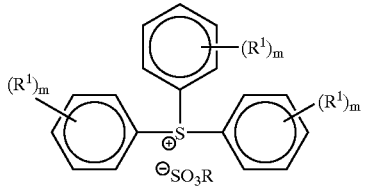

wherein each $R^1$ is independently hydrogen or $C_{1-12}$alkyl; each m is independently an integer of from 0 to 5, and preferably each m is 0, 1 or 2; and R is as defined above, i.e. camphor, adamantane, alkyl (e.g. $C_{1-12}$alkyl) and perfluoroalkyl such as perfluoro($C_{1-12}$alkyl), particularly perfluoro counter anions of perfluorooctanesulfonate, perfluorononylsulfonate and the like.

Other known PAGS also may be employed in the resists of the invention.

A preferred optional additive is an added base, particularly tetrabutylammonium hydroxide (TBAH), or a lactate salt of TBAH, which can enhance resolution of a developed resist relief image. The added base is suitably used in relatively small amounts, e.g. about 0.01 to 5 percent by weight relative to the photoactive component (PAG).

Photoresists of the invention also may contain other optional materials such as anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether, propylene glycol monomethyl ether; and 3-ethoxy ethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 $mJ/cm^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 150 to 300 or 450 nm. A particularly preferred exposure wavelength is about 248 nm. As discussed above, polymers of the invention also will be useful for resists imaged at wavelengths less than about 200 nm, such as 193 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate, quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream. After such processing, resist may be removed from the processed substrate using known stripping procedures.

All documents mentioned herein are fully incorporated herein by reference. The following non-limiting examples are illustrative of the invention.

EXAMPLE 1
Polymer Synthesis

A 500 ml three necked round bottomed flask is charged with monomers as specified below in Table 1 along with 150 g tetrahydrofuran and fitted with a pressure-equalizing dropping funnel, a water cooled reflux condenser and rubber septa on both the dropping funnel and the flask. The top of the reflux condenser is fitted with an oil bubbler to prevent backflow of air. The monomer charge is purged by bubbling dry nitrogen through the solution for 15 minutes. The dropping funnel is charged with 100 g tetrahydrofuran and 4.2 g (17 mmol) pentanitrile, 2,4-dimethyl, 2,2'-azobis initiator and purged with dry nitrogen as above. Once the nitrogen purges are completed the monomer mixture is heated to reflux and the initiator solution is added slowly over 20 minutes. The entire solution is held at reflux for 14 hours. The resultant polymer solution is precipitated in hexane and dried according to standard procedures.

TABLE 1

| Monomer | Mass of Charge, g | Moles of Charge |
| --- | --- | --- |
| Isobornyl methacrylate | 40 | 0.18 |
| exo(7-thiabicyclo 2,2,1 heptanyl) 2-methacrylate | 30 | 0.15 |
| Itaconic Anhydride | 15 | 0.13 |
| Methacrylic Acid | 5 | 0.06 |
| Methacrylonitrile | 10 | 0.15 |

EXAMPLE 2
Polymer Synthesis

The same reaction is performed as in Example 1 except with the monomer charge given in Table 2.

TABLE 2

| Monomer | Mass of Charge, g | Moles of Charge |
| --- | --- | --- |
| Isobornyl methacrylate | 40 | 0.18 |
| endo(1-oxybicyclo 2,2,1 heptanyl) 4-methacrylate | 30 | 0.16 |
| Itaconic Anhydride | 15 | 0.13 |

TABLE 2-continued

| Monomer | Mass of Charge, g | Moles of Charge |
| --- | --- | --- |
| Methacrylic Acid | 5 | 0.06 |
| Methacrylonitrile | 10 | 0.15 |

EXAMPLE 3
Photoresist Preparation and Processing

A photoresist composition of the invention is prepared by mixing the following components with amounts expressed as weight percents based on total weight of the resist composition.

| Resist Components | Amount (wt. %) |
| --- | --- |
| Resin Binder | 15 |
| Photoacid Generator | 4 |
| Ethyl Lactate | 81 |

The resin binder is the copolymer formed in Example 1 above and the photoacid generator is di-(4-t-butylphenyl) iodonium (+/−)-10-camphor sulfonate (PAG 1 above).

The photoresist composition is spin coated onto HMDS vapor primed 4 inch bare silicon wafers and softbaked via a vacuum hotplate at 120° C. for 60 seconds. The resist coating layers are are exposed through a photomask at 193 nm, and then silicon wafers are post-exposure baked (PEB) at about 110° C. The wafers are treated with 0.26 N aqueous tetramethylammonium hydroxide solution to provide a relief image.

The foregoing description of the invention is merely illustrative thereof, and it is understood that variations and modification can be made without departing from the spirit of scope of the invention as set forth in the following claims.

What is claimed is:

1. A positive-acting photoresist composition comprising a photoacid generator and a polymer,
   the polymer 1) being substantially free of aromatic groups; and 2) comprising polymerized acrylate groups and pendant acid-labile groups that contain an optionally substituted cycloalkyl group having 4 ring carbon atoms.

2. The photoresist of claim 1 wherein the polymer comprises alkyl ester groups.

3. The photoresist of claim 1 wherein the polymer comprises polymerized alkyl acrylate groups.

4. The photoresist of claim 3 wherein the alkyl acrylate groups comprise the optionally substituted cycloalkyl group having 4 ring carbon atoms.

5. The photoresist of claim 1 wherein the optionally substituted cycloalkyl group having 4 ring carbon atoms is a component of the polymerized acrylate groups.

6. The photoresist composition of claim 1 wherein the photoresist composition consists essentially of the photoacid generator compound and the polymer.

7. The photoresist composition of claim 1 wherein the photoresist composition consists essentially of the photoacid generator compound, the polymer and a base component.

8. An article of manufacture comprising a substrate having coated thereon a photoresist composition of claim 1.

9. The article of claim 8 wherein the substrate is a microelectronic wafer.

\* \* \* \* \*